United States Patent [19]

Easter

[11] Patent Number: 5,478,758
[45] Date of Patent: Dec. 26, 1995

[54] METHOD OF MAKING A GETTERER FOR MULTI-LAYER WAFERS

[75] Inventor: William G. Easter, Wernersville, Pa.

[73] Assignee: AT&T Corp., Murray Hill, N.J.

[21] Appl. No.: 253,514

[22] Filed: Jun. 3, 1994

[51] Int. Cl.⁶ .................................. H01L 21/306
[52] U.S. Cl. .................. 437/10; 437/12; 437/61; 148/DIG. 50
[58] Field of Search ................... 437/10, 12, 61, 437/63, 64, 62, 67; 148/DIG. 50

[56] References Cited

U.S. PATENT DOCUMENTS

| | | | |
|---|---|---|---|
| 4,621,414 | 11/1986 | Iranmanesh | 148/DIG. 50 |
| 4,631,804 | 12/1986 | Roy | 29/576 W |
| 4,661,202 | 4/1987 | Ochii | 437/63 |
| 5,059,550 | 10/1991 | Tateoka ewt al. | 437/63 |
| 5,084,408 | 1/1992 | Baba et al. | 437/61 |
| 5,116,779 | 5/1992 | Iguchi | 437/64 |
| 5,272,104 | 12/1993 | Schrantz et al. | 437/63 |
| 5,290,716 | 3/1994 | Nakamura | 437/40 |
| 5,294,562 | 3/1994 | Lur et al. | 437/63 |
| 5,306,942 | 4/1994 | Fujii | 257/508 |

FOREIGN PATENT DOCUMENTS

| | | | |
|---|---|---|---|
| 0258681 | 7/1988 | Germany | 437/12 |
| 0002657 | 1/1979 | Japan | 437/12 |
| 62-76646 | 4/1987 | Japan | 437/62 |
| 0148855 | 6/1990 | Japan | 437/62 |
| 2237120 | 9/1990 | Japan | 437/12 |
| 5291265 | 11/1993 | Japan | 437/12 |

OTHER PUBLICATIONS

Wolf et al., vol. I, Silicon Processing For the VLSI Era, Lattice Press, 1986.

*Primary Examiner*—Brian E. Hearn
*Assistant Examiner*—Lynne A. Gurley
*Attorney, Agent, or Firm*—Scott W. McLellan

[57] ABSTRACT

A method of making a gettering structure for dielectrically isolated wafer structures, such as bonded wafers. A getterer layer is deposited over the wafer having semiconductor regions isolated from each other by trenches. The polysilicon is etched back leaving the polysilicon on the sides of the regions. The polysilicon may be doped. The polysilicon is oxidized and a second layer of polysilicon may be deposited to fill voids in the trenches.

13 Claims, 1 Drawing Sheet

METHOD OF MAKING A GETTERER FOR MULTI-LAYER WAFERS

CROSS-REFERENCE TO RELATED APPLICATION

This application is related to a co-pending patent application titled "Getterer For Multi-Layer Wafers", by W. G. Easter, Ser. No. 08/253,657, filed simultaneously with, and assigned to the same assignee, as this application.

BACKGROUND OF THE INVENTION

To reduce the effects of contaminants on IC performance, a gettering layer, such as implanted phosphorus, may be added to the backside of the IC wafer. The gettering material traps impurities, such as sodium or metals, that diffuse within the wafer. To make the gettering layer effective, it is desirable that the gettering not be depleted, i.e., any electric field in the gettering layer is insufficient to substantially deplete at least a portion of the gettering layer of charges. Further, for the gettering to be effective, the gettering layer should not be isolated from any semiconductor portion of the IC wafer, such as by an insulating layer of silicon dioxide.

Bonded wafer technology, a form of dielectric isolation, poses a challenge to existing gettering technology. In a typical bonded wafer, active and passive devices are formed in a working semiconductor layer isolated by an insulating layer from a semiconductor layer which is used as a handle layer and gives support to the working layer. However, placing a gettering layer on the handle layer is not effective to getter impurities in the working layer because of the insulating layer. Placing the gettering layer on the working layer may not be effective because there is a high likelyhood that portions of the gettering layer will be depleted.

Therefore, it is desirable to provide an effective gettering technique that is effective for bonded wafers or other dielectrically isolated wafer technologies.

Further, it is desirable to provide a single process for providing a effective getterer for bonding Wafers or other dielectrically isolated wafer technologies.

SUMMARY OF THE INVENTION

These and other aspects of the invention may be obtained generally in a wafer having a working layer and a handle layer, the working layer being divided into portions by trenches, each working layer portion having minor surfaces formed by the trenches. Gettering may be provided for the working layer portions by a gettering layer on at least one of the minor surfaces.

Further, the above aspects of the invention may be obtained generally by a method for making a wafer, the wafer having a working layer and a handle layer. A trench is cut in the working layer to form portions thereof, the portions having minor surfaces. Then a gettering layer is formed on at least one of the minor surfaces to serve as the getterer for the corresponding portion.

BRIEF DESCRIPTION OF THE DRAWING

The foregoing features of the invention, as well as the invention itself, may be more fully understood from the following detailed description of the drawings, in which.

DETAILED DESCRIPTION

Figure 4:
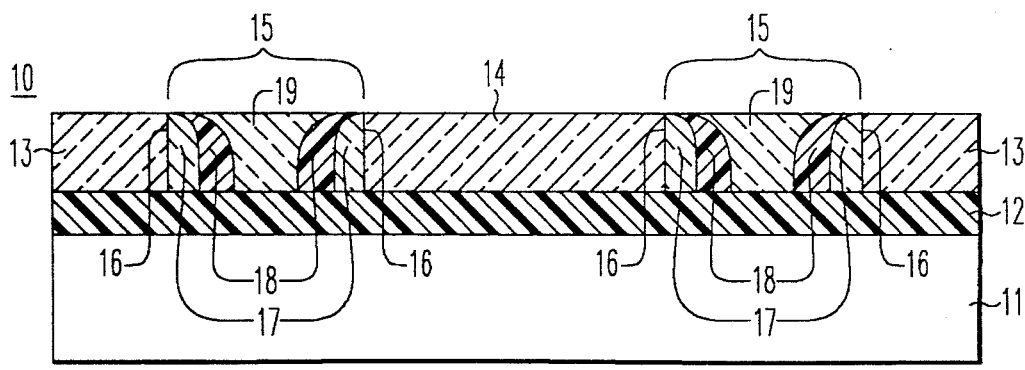

In FIG. 4 the exemplary completed wafer 10 is shown in accordance with one aspect of the invention. A working layer 13, here silicon, is separated into portions 14 by trenches 15. An insulating layer 12, such as silicon dioxide or silicon nitride, separates the working layer portions 14 from the handle layer 11. The handle layer 11 may be silicon, polysilicon, etc. The wench 15 extends completely through the working layer 13 to the insulating layer 12. Polysilicon "fillets" 17 on the minor surfaces 16 of the portions 14 serve as the getterer for each portion 14. An oxide 18 over the polysilicon getterers 17 serves to retain the isolation of the portions 14 from polysilicon fill 19.

Figure 1:
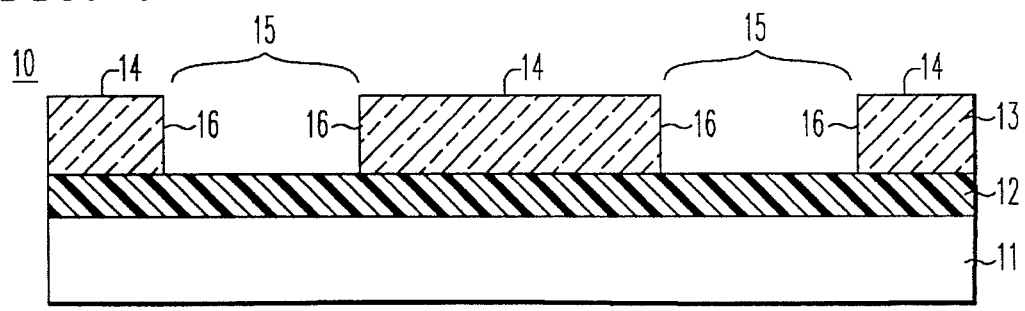
FIGS. 1–4 are simplified cross sectional views of an exemplary wafer (not to scale) showing a series of exemplary steps to form an exemplary embodiment of the invention, here a gettering layer on the minor surfaces of the isolated portions of a working layer on a wafer.
Figure 2:
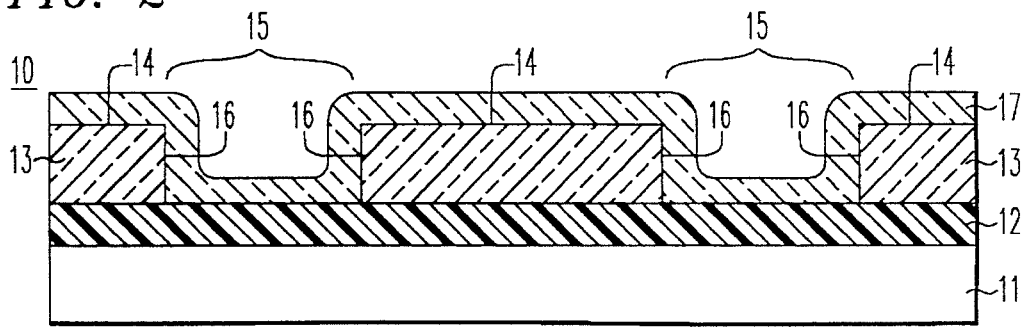
Figure 3:
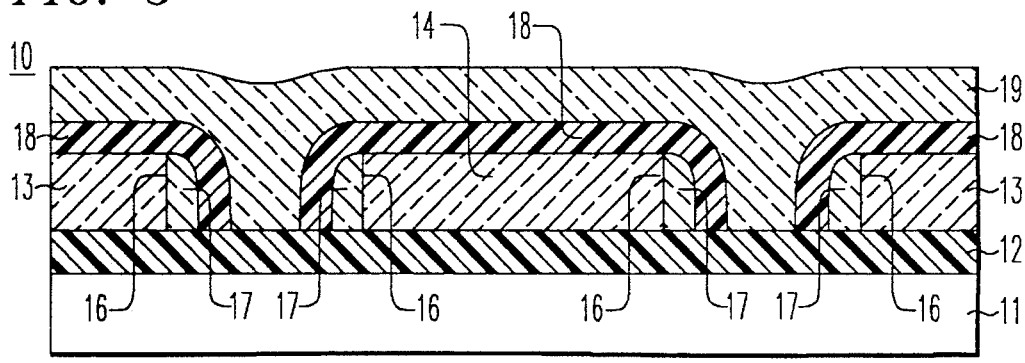

The FIGS. 1–3 provide more detail and assist in explaining the preferred exemplary method of fabricating the exemplary structure shown in FIG. 4.

In FIG. 1, an exemplary dielectrically isolated wafer 10 is shown having a handle layer 11, an insulating layer 12 and a working layer 13. Such a wafer 10 may be fabricated by a wafer bonding technique using the exemplary process shown in U.S. Pat. No. 4,883,215. Alternatively, the wafer 10 may be fabricated by other dielectric isolation (DI) techniques, such as that disclosed in U.S. Pat. No. 4,820,653 and assigned to the same assignee as this invention.

As shown in FIG. 1, the working layer 13 is divided into portions 14 by trenches 15. The trenches 15 are defined by photoresist (not shown) and preferably etched by an anisotropic etch to form minor surfaces 16. The trenches 15 preferably extend completely to the insulator layer 12. Thus, a portion 14 is electrically isolated from other portions 14.

In FIG. 2, the wafer 10 has deposited thereon a polysilicon layer 17 which covers the entire top surface of the wafer 10. The polysilicon layer 17 covers the minor surfaces 16 of the portions 14 to act as the getterer for the portions 14. It is understood that where gettering is not needed or desirable, the polysilicon layer 17 may be selectively deposited, such as by masking with photoresist (not shown). Further, to enhance the gettering capability of the polysilicon, the polysilicon may be doped, such as by phosphorus. Deposition of the polysilicon may be made by any well known process.

The gettering effect of the polysilicon layer 17 should be provided at the minor surfaces 16 because any electric fields within the portions 14 do not extend at sufficient strength to deplete the interface between the polysilicon 17 and the silicon in the portions 14. Doping the polysilicon 17 further enhances the resistance of the polysilicon 17 to depletion.

The polysilicon layer 17 is etched back to remove the polysilicon except above the minor surfaces 16 to leave "fillets" along the portions 14. Then an oxide layer 18 is grown to cover the polysilicon layer 17. Preferably, the oxide 18 is a thermal oxide, although a deposited oxide could be used. Then the remaining space in the trenches 15 is filled with polysilicon 19. The polysilicon 19 is etched back to leave the polysilicon 19 in the trenches 15. Then the oxide 18 is etched back to leave the major surfaces of portions 14 exposed for forming transistors, diodes, resistors, etc. The result is the structure shown in FIG. 4. The oxide layer 18 also serves to isolate the portions 14 from each other when the trenches 15 are filled.

It is envisioned that if the polysilicon fillets 17 in FIG. 3 are doped, the wafer 10 can be exposed to a high temperature anneal to drive the dopant from the fillets 17 into the minor surfaces 16 for the getterer in each portion 14. Then the polysilicon fillets 17 could be removed. It is understood, however, that the thermal oxidation to create the oxide layer 18 may perform some drive-in of any dopants from fillets 17 into minor surfaces 16 mentioned above. It is not necessary to remove the fillets 17 if dopant drive-in is used.

Exemplary thickness for the polysilicon fillets 16 range between 0.5 and 2 microns. The thickness of the oxide layer 18 range between 0.05 and 4 microns.

It is understood that the above gettering technique may be applied to wafers 10 without dielectric isolation, i.e., without insulating layer 12. The above described gettering techniques should be applicable to junction isolated layers 13, 11 (such as by heterojunctions or homojunctions) or even single layer wafers 10 where there is not distinction between layers 13 and 11.

Having described the preferred embodiment of this invention, it will be apparent to one of skill in the art that other embodiments in incorporating its concept may be used. Therefore, this invention should not be limited to the disclosed embodiment, but rather should be limited only by the spirit and scope of the appended claims.

I claim:

1. A method of making a wafer, the wafer having a working layer and a handle layer, CHARACTERIZED BY THE STEPS OF:

trenching the working layer to form portions thereof having minor surfaces;

depositing polysilicon over the working layer and in the trenches to cover the minor surfaces; and etching the polysilicon back to retain the polysilicon on the minor surfaces;

wherein the polysilicon on the minor surfaces is a gettering layer.

2. The method recited in claim 1, further characterized by the steps of:

forming an oxide on at least said gettering layer; and filling the trench with polysilicon.

3. The method recited in claim 2, wherein the step of filling the trench with polysilicon is further characterized by the steps of:

depositing polysilicon over the working layer to ensure the filling of the trenches; and etching back the polysilicon to leave the polysilicon in the trenches.

4. The method recited in claim 3, wherein the oxide is thermally grown.

5. The method recited in claim 4, wherein said gettering layer is doped.

6. The method recited in claim 3, wherein said gettering layer is doped with phosphorus.

7. The method recited in claim 3, wherein the handle layer and the working layer are separated by an insulating layer and the the filled trench extends through the working layer to the insulating layer.

8. The method recited in claim 7, wherein the insulating layer is silicon dioxide and the wafer is a bonded wafer.

9. A method of making a wafer, the wafer having a working layer and a handle layer separated from the working layer by an insulating layer, CHARACTERIZED BY THE STEPS OF:

trenching the working layer to form portions thereof having minor surfaces, the trench extending to the insulating layer;

depositing a polysilicon gettering layer on at least one of the minor surfaces;

etching the polysilicon back to retain the polysilicon on the minor surfaces;

forming an oxide on at least the polysilicon gettering layer;

depositing polysilicon over the working layer to ensure the filling of the trenching and etching back the polysilicon to leave the polysilicon in the trenches.

10. The method recited in claim 9, wherein the oxide is thermally grown.

11. The method recited in claim 10, wherein the polysilicon gettering layer is doped.

12. The method recited in claim 11, wherein the polysilicon dopant is a phosphorus.

13. The method recited in claim 9, wherein the wafer is a bonded wafer.

* * * * *